(12) United States Patent
Asano

(10) Patent No.: US 6,667,640 B2
(45) Date of Patent: Dec. 23, 2003

(54) PHASE LOCKED LOOP CIRCUIT HAVING A WIDE OSCILLATION FREQUENCY RANGE FOR REDUCING JITTER

(75) Inventor: Shigetaka Asano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/106,257

(22) Filed: Mar. 27, 2002

(65) Prior Publication Data

US 2003/0076140 A1 Apr. 24, 2003

(30) Foreign Application Priority Data

Oct. 23, 2001 (JP) ........................... 2001-324756

(51) Int. Cl.$^7$ ................................ H03L 7/06
(52) U.S. Cl. ........................ 327/147; 327/157
(58) Field of Search ........................... 327/146, 147, 327/154, 155, 156, 157, 163, 148; 331/25, DIG. 2; 375/215, 226, 373, 374, 375, 376

(56) References Cited

U.S. PATENT DOCUMENTS 5,334,952 A * 8/1994 Maddy et al. ............... 331/1 A
6,121,844 A * 9/2000 Suzuki ....................... 331/17
6,308,055 B1 * 10/2001 Welland et al. ............. 455/260
6,329,872 B1 * 12/2001 Foroudi ..................... 327/541

FOREIGN PATENT DOCUMENTS

JP          11-177416         7/1999

* cited by examiner

Primary Examiner—Timothy P. Callahan
Assistant Examiner—Linh Nguyen
(74) Attorney, Agent, or Firm—Arent Fox Kintner Plotkin & Kahn

(57) ABSTRACT

A PLL circuit having a wide oscillation frequency range for reducing a jitter. The PLL circuit including a phase comparator for generating a phase difference signal by comparing a phase of a reference signal with a phase of a comparison signal. An oscillator generates an oscillation frequency signal having an oscillation frequency according to a control signal having a current corresponding to the phase difference signal. A detection circuit generates a detection signal by detecting the current of the control signal. A signal generation circuit generates a signal for changing the oscillation frequency of the oscillator such that the current of the control signal is within a predetermined range in accordance with the detection signal.

20 Claims, 9 Drawing Sheets

PHASE LOCKED LOOP CIRCUIT HAVING A WIDE OSCILLATION FREQUENCY RANGE FOR REDUCING JITTER

BACKGROUND OF THE INVENTION

The present invention relates to a phase locked loop (PLL) circuit and, more particularly, a PLL circuit having a relatively wide frequency oscillation range.

BACKGROUND INFORMATION

In recent years, efforts have been made to achieve a higher density of information recorded in a recording medium such as a digital data storage (DDS), a digital versatile disk (DVD), or a compact disk (CD), as well as in a recording device such as a hard disk drive (HDD), and to achieve a higher speed for reading/writing information. A recording/reproducing device has been presented for surely recording information at a writing speed enough for recording, and reading information at a reading speed higher than the writing speed. In a recording/reproducing device using a disk recording medium, a reading speed is greatly changed according to a head position in a radial direction of the disk. Thus, a PLL circuit for generating a clock signal for reading/writing must have a wide frequency oscillation range, and jitters of the PLL circuit are required to be reduced.

FIG. 1 is a schematic block diagram of a conventional PLL circuit 61. The PLL circuit includes a phase comparator 62, a charge pump 63, a loop filter 64, a voltage/current converter (referred to as V/I converter, hereinafter) 65, a current controlled oscillator (CCO or ICO (referred to as ICO, hereinafter)) 66, and a frequency divider 67.

The phase comparator 62 compares a phase of a reference signal fr with a phase of a frequency-divided signal supplied from the frequency divider 67, and generates an up signal UP and a down signal DN each having a pulse width corresponding to a phase difference.

The charge pump 63 generates a charge pump output signal SCP having a current corresponding to the up signal UP and the down signal DN supplied from the phase comparator 62.

The loop filter 64 is a low-pass filter (LPF) including a resistor and a capacitor, and removes a high-frequency component contained in the charge pump output signal SCP, and generates a filtered output signal SLF having a voltage.

The V/I converter 65 performs voltage/current conversion for the filtered output signal SLF, and generates a control signal SI having a current corresponding to a voltage of the filtered output signal SLF.

The ICO 66 generates an oscillation frequency signal fi having a frequency corresponding to a current of the control signal SI, supplies this oscillation frequency signal fi as a PLL oscillation signal to an external circuit (not shown), and the frequency divider 67.

The frequency divider 67 divides a frequency of the oscillation frequency signal fi of the ICO 66 into a predetermined frequency-divided value (ratio of divided frequency), and generates a frequency-divided signal fp. The frequency-divided signal fp is fed back to the phase comparator 62.

In place of the V/I converter 65 and the ICO 66, a voltage controlled oscillator (VCO) may be used for generating an oscillation frequency signal fi having a frequency corresponding to a voltage of the filtered output signal SLF of the loop filter 64.

In the PLL circuit 61, if a frequency of the oscillation frequency signal fi is smaller than a desired locked frequency, a frequency of the frequency-divided signal fp becomes smaller than that of the reference signal fr, generating a phase difference between the frequency-divided signal fp and the reference signal fr. In this case, the phase comparator 62 generates an up signal UP having a pulse width larger than that of a down signal DN. In response to the up signal UP, the charge pump 63 charges the loop filter 64 for a period longer than a discharging period. Accordingly, a voltage of the filtered output signal SLF of the loop filter 64 increases. The V/I converter 65 generates a control signal SI having a current corresponding to the voltage of the filtered output signal SLF. Then, in response to the control signal SI, the ICO 66 increases a frequency of the oscillation frequency signal fi.

If a frequency of the oscillation frequency signal fi is larger than the desired locked frequency, a frequency of the frequency-divided signal fp becomes larger than that of the reference signal fr. In this case, the phase comparator 62 generates an up signal UP having a pulse width smaller than that of a down signal DN. In response to the up signal UP, the charge pump 63 charges the loop filter 64 for a period shorter than a discharging period. Accordingly, a voltage of the filtered output signal SLF of the loop filter 64 decreases. The V/I converter 65 generates a control signal SI by performing voltage/current conversion for the filtered output signal SLF. Then, in response to the control signal SI, the ICO 66 reduces a frequency of the oscillation frequency signal fi.

By repeating the above-mentioned operations, an oscillation frequency signal fi having a frequency matched (locked) with the desired frequency is output from the ICO 66.

FIG. 2 is a schematic block diagram showing a conventional timing recovery PLL circuit (referred to as TR-PLL, hereinafter) 71. The TR-PLL 71 includes, in addition to the components of the PLL circuit 61 of FIG. 1, a timing recovery control circuit (referred to as TR control circuit, hereinafter) 72, a current controller 73, and an ICO 74. Components of FIG. 2 similar to those of FIG. 1 are denoted by similar reference numerals.

A V/I converter 65a receives a filtered output signal SLF from a loop filter 64, and generates a control signal SI1 for controlling an oscillation frequency of a first ICO 66, and a control signal SI3 for controlling an oscillation frequency of a second ICO 74 by performing voltage/current conversion for the filtered output signal SLF. A current of the control signal SI1 is substantially equal to that of the control signal SI3.

The TR control circuit 72 receives a reading signal RD, and detects a phase difference of the reading signal RD with respect to an oscillation frequency signal ftr of the second ICO 74 by using the reading signal RD, thus generating a control signal STR. The reading signal RD is a signal read from a recording medium (not shown) according to the oscillation frequency signal ftr output from the second ICO 74.

The current controller 73 includes a digital/analog converter (DAC). The current controller 73 corrects a current I3 of the control signal SI3 in accordance with the control signal STR output from the TR control circuit 72, and generates a control signal SI4 having a corrected current I4. For example, the TR control circuit 72 generates a control signal STR having a corrected value d corresponding to a phase difference of the reading signal RD. In response to the control signal STR, the current controller 73 corrects the current I3 of the control signal SI3, and generates a control signal I4 having a corrected current I4 {I4=I3×d}.

The second ICO 74 generates an oscillation frequency signal ftr having a frequency corresponding to the corrected current I4 of the control signal SI4 from the current controller 73. Then, data recorded in the recording medium is read in accordance with the oscillation frequency signal ftr.

Therefore, a frequency of the reading signal RD read from the recording medium is matched (locked) with that of the oscillation frequency signal ftr of the second ICO 74, stabilizing a reading operation.

In the PLL circuit 61 of FIG. 1, an oscillation frequency of the ICO 66 corresponds to a current of the control signal SI of the V/I converter 65 (i.e., voltage of the filtered output signal SLF of the loop filter 64). In other words, when a current of the control signal SI (voltage of the filtered output signal SLF) decreases, an oscillation frequency of the ICO becomes small. Thus, in the case where the current of the control signal SI (voltage of the filtered output signal SLF) is lowered to a predetermined value or lower, the ICO 66 is not oscillated in some cases.

In addition, when the ICO 66 is oscillated by a relatively small current (voltage), phase fluctuation of an oscillation frequency caused by noise, i.e., jitters, increase. Consequently, the oscillation of the ICO 66 becomes unstable, causing, for example unlocking.

FIG. 3 is a graph showing a relation between a current and an oscillation frequency in an ICO. As shown in FIG. 3, a fluctuation width in a current by noise is set to ΔI. When a current is relatively large, a jitter ΔF1 is smaller than a jitter ΔF2 when a current is relatively small. That is, jittering increases as a current decreases. One of the other factors for an increase in a jitter, may be use of, for example transistors shifted from a saturated region as the ICO 66. If a current of a certain level is not flowing in the transistor, the transistor enters a state of being shifted from the saturated region (unsaturated region). It is generally known that in this state, an operational characteristic of the transistor becomes unstable. Accordingly, when a current decreases, a control characteristic of the ICO 66 becomes unstable, increasing a jitter. Consequently, it was impossible to increase an oscillation frequency of the ICO 66.

Further, if a current having a certain value or higher is supplied to the ICO 66 (indicated by SAT in FIG. 3), almost no changes occur in an oscillation frequency even if a current increases. In this case, a jitter decreases, but it is difficult to change the oscillation frequency of the ICO 66.

Various problems described above occur even in the TR-PLL 71 of FIG. 2. Also, it is generally known that in the TR-PLL 71, if the first and second ICO 66 and ICO 74 are physically close to each other, an oscillation frequency of the second ICO 74 is drawn into an oscillation frequency of the first ICO 66 in a particular frequency band. That is, the oscillation frequency of the second ICO 74 cannot be changed. Thus, normally, by interconnecting the V/I converter 65a and the current controller 73 with a relatively long wire L2, a larger distance is set between the first and second ICO 66 and ICO 74. However, use of such a long wire L2 makes it easy for the wire L2 to be affected by noise, consequently increasing a jitter in the second ICO 74.

Japanese Laid-Open Patent Publication No. 6-104748 discloses a PLL circuit, which includes a plurality of VCO (or ICO) having center frequencies different from each other, and a selector for selecting one of the VCOs. With the configuration of this PLL circuit, if a voltage (current in the case of ICO) decreases to a predetermined value or lower, or oscillation is impossible in the VCO, an oscillation frequency range of the PLL circuit increases by selecting another VCO to cause oscillation. In addition, if a jitter is large even when oscillation can be performed by the VCO, the jitter can be reduced by similarly switching to another VCO.

However, the presence of the plurality of VCO (or ICO) has a drawback of increasing a size of the PLL circuit. Especially, in the case of the TR-PLL 71 of FIG. 2, since the first and second ICO 66 and ICO 74 ideally having similar characteristics are provided, the circuit size is increased more. That is, in the case of the TR-PLL 71, if the PLL circuit 61 of FIG. 1 includes ICO amounting to n in number, (2×n) pieces of ICO are necessary.

In addition, Japanese Laid-Open Patent Publication No. 11-177416 discloses a PLL circuit, which detects a device characteristic change of a VCO (or ICO) control signal caused by manufacturing condition fluctuation, and adds an offset signal based on a result of the detection to the VCO control signal. With the configuration of this PLL circuit, by reducing changes in the VCO control characteristics caused by manufacturing condition fluctuation, power supply fluctuation, and temperature changes, a fluctuation range ΔI (see FIG. 3) of an oscillation frequency control current of the ICO by noise is reduced, thus reducing an effect on an oscillation frequency.

The PLL circuit described in Japanese Laid-Open Patent Publication No. 11-177416 includes a circuit (e.g., ADC) for generating an offset signal. Thus, this PLL circuit has had a drawback of increasing its circuit size. Moreover, even if fluctuation in the oscillation frequency control current of the ICO caused by manufacturing conditions and the like can be reduced, it has been impossible to increase an oscillation frequency range.

SUMMARY OF THE INVENTION

An object of the present invention is to provide a PLL circuit having a wide oscillation frequency range, and capable of reducing a jitter.

In a first aspect of the present invention, a PLL circuit including a phase comparator for generating a phase difference signal by comparing a phase of a reference signal with a phase of a comparison signal is provided. An oscillator is connected to the phase comparator to generate an oscillation frequency signal having an oscillation frequency according to a control signal having one of a current and a voltage corresponding to the phase difference signal. A detection circuit generates a detection signal by detecting one of the current and the voltage of the control signal. A signal generation circuit is connected to the detection circuit to generate a signal for changing the oscillation frequency of the oscillator such that one of the current and the voltage of the control signal is within a predetermined range in accordance with the detection signal.

In a second aspect of the present invention, the PLL circuit including a phase comparator for generating a phase difference signal by comparing a phase of a reference signal with a phase of a comparison signal is provided. An oscillator is connected to the phase comparator to generate an oscillation frequency signal having an oscillation frequency according to a control signal having one of a current and a voltage corresponding to the phase difference signal. A first frequency divider is connected to the oscillator to generate a PLL oscillation frequency signal by frequency-dividing the oscillation frequency signal with a first frequency dividing value. A detection circuit generates a detection signal by detecting one of the current and the voltage of the control signal. A signal generation circuit is connected to the detection circuit to generate a signal for changing the oscillation frequency of the oscillator such that one of the current and the voltage of the control signal is within a predetermined range in accordance with the detection signal.

In a third aspect of the present invention, a PLL circuit including a phase comparator for generating a phase difference signal by comparing a phase of a reference signal with a phase of a comparison signal is provided. A first oscillator generates a first oscillation frequency signal having an oscillation frequency according to a first control signal having one of a current and a voltage corresponding to the phase difference signal. A second oscillator generates a second oscillation frequency signal having an oscillation frequency according to a second control signal originated from the first control signal, having one of a current and a voltage. A detection circuit generates a detection signal by detecting one of the current and the voltage of the first control signal. A signal generation circuit is connected to the detection circuit to generate a signal for changing the oscillation frequency of the first oscillator such that one of the current and the voltage of the second control signal is within a predetermined range in accordance with the detection signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
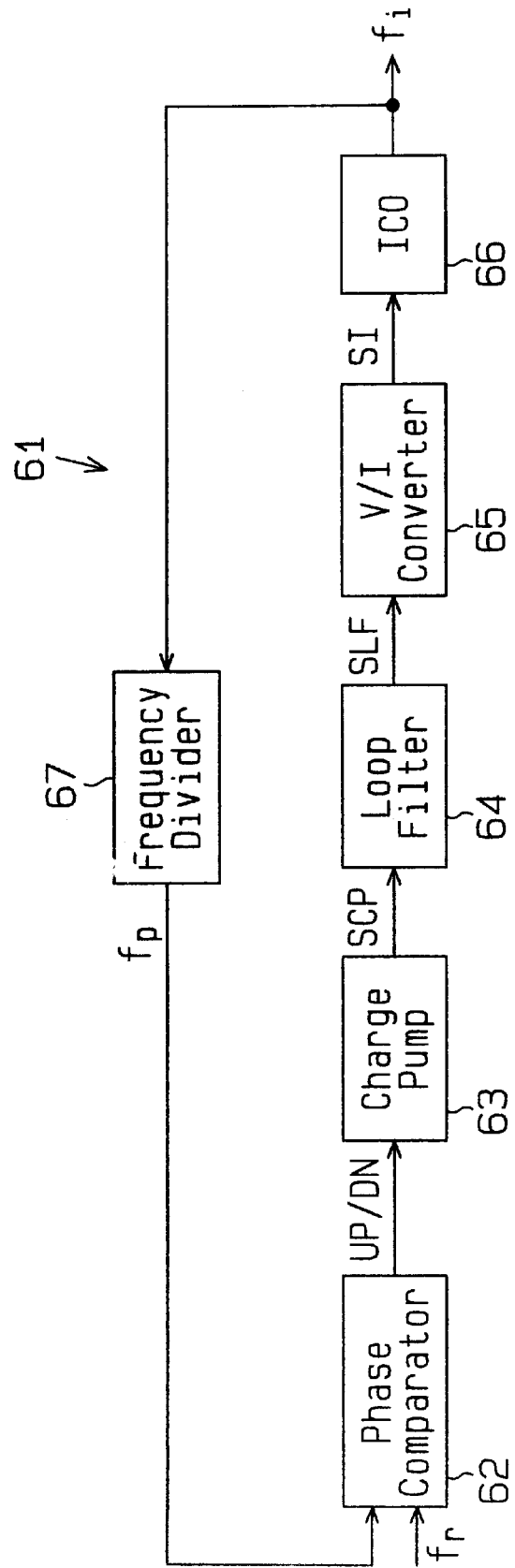
FIG. 1 is a schematic block diagram of a conventional PLL circuit.
Figure 2:
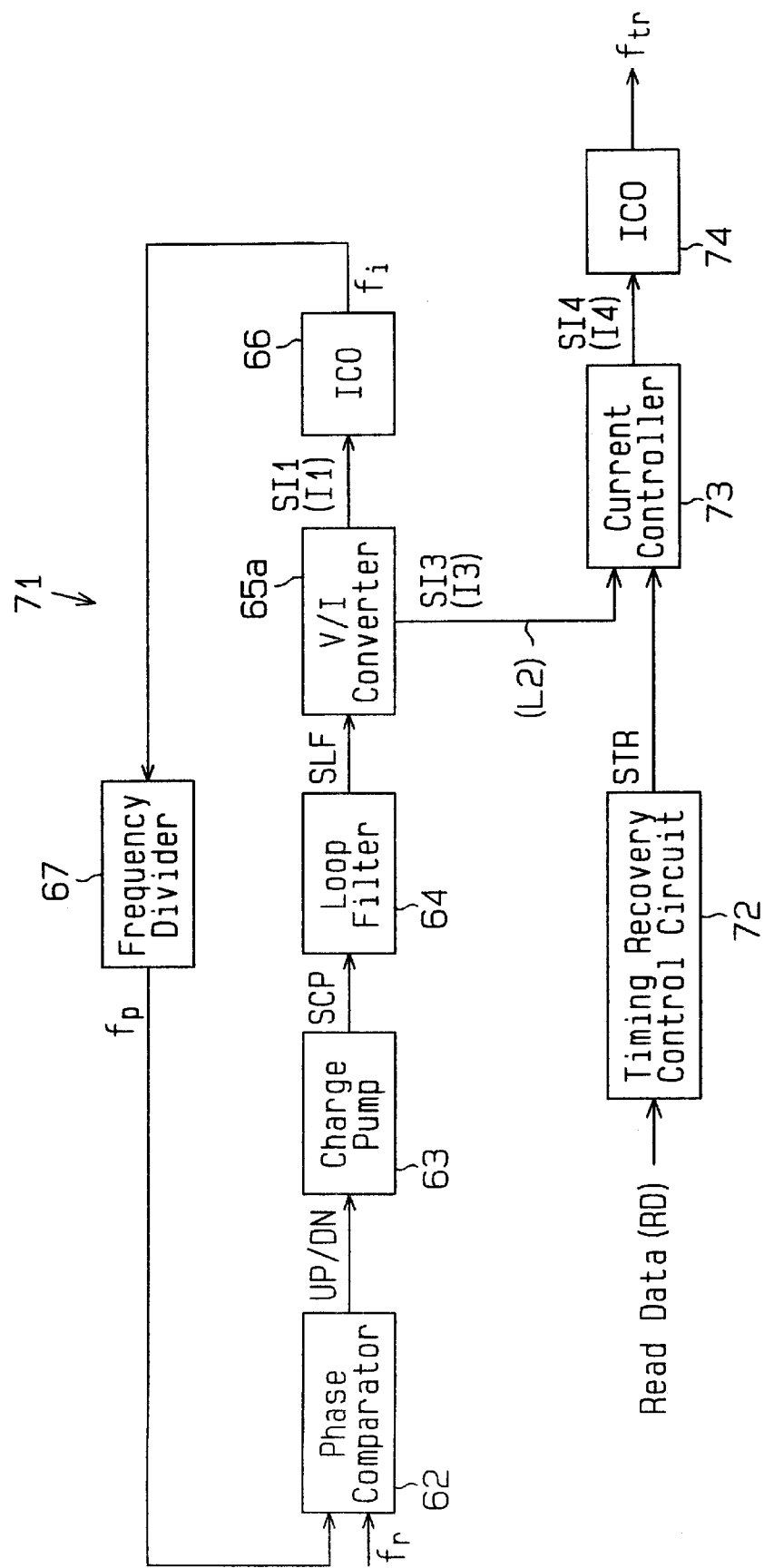
FIG. 2 is a schematic block diagram of a conventional TR-PLL.

In the drawings, like numerals are used for like elements throughout.

Figure 4:
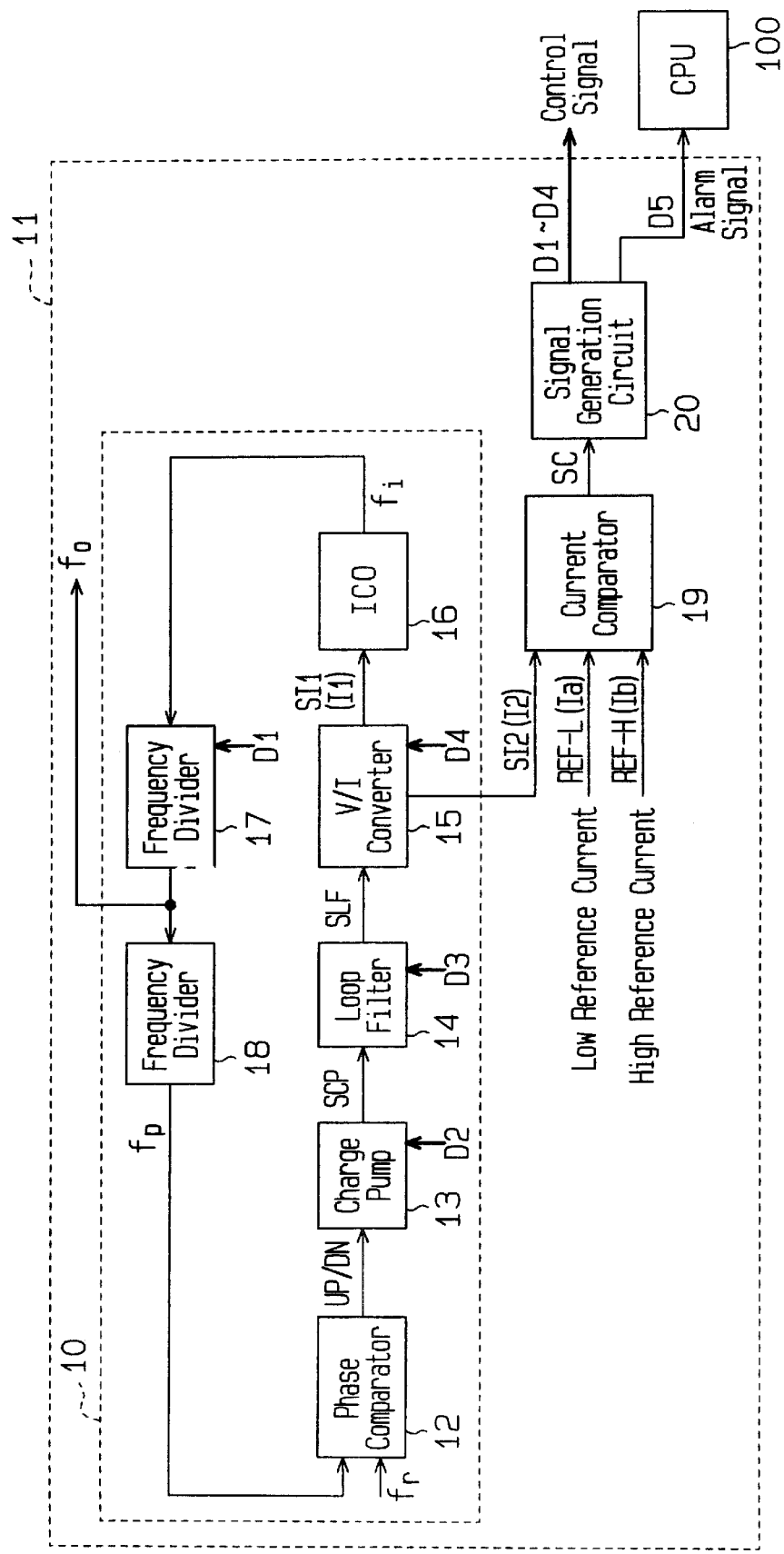
FIG. 4 is a schematic block diagram showing a PLL circuit according to a first embodiment of the present invention.

As shown in FIG. 4, a PLL circuit 11 according to a first embodiment of the present invention includes a phase comparator 12, a charge pump 13, a loop filter 14, a voltage/current converter (referred to as V/I converter, hereinafter) 15, a current controlled oscillator (CCO or ICO (referred to as ICO, hereinafter)) 16, a first frequency divider 17, a second frequency divider 18, a current comparator 19 as a detection circuit, and a signal generation circuit 20.

The phase comparator 12 compares a phase of a reference signal fr with a phase of a second frequency divided signal fp supplied from the second frequency divider 18, and generates an up signal UP and a down signal DN each having a pulse width corresponding to a phase difference. The phase comparator 12, the charge pump 13, the loop filter 14, the V/I converter 15, the ICO 16, and the first and second frequency dividers 17 and 18 constitute a PLL loop 10.

The charge pump 13 generates a charge pump output signal SCP having a current corresponding to pulse widths of the up signal UP and the down signal DN supplied from the phase comparator 12.

The loop filter 14 is a low-pass filter (LPF) including a resistor and a capacitor, and operates as a load on the charge pump 13. Specifically, in response to the up signal UP from the phase comparator 12, the charge pump 13 performs a charging operation to increase an amount of charges of the loop filter 14. In response to the down signal DN from the phase comparator 12, the charge pump 13 performs a discharging operation to reduce the amount of charges stored in the loop filter 14. The loop filter 14 removes a high-frequency component contained in the charge pump outputs signal SCP, and generates a filtered output signal SLF having a voltage.

The V/I converter 15 performs voltage/current conversion for the filtered output signal SLF, and generates a first current signal SI1 having a current I1 corresponding to a voltage of the filtered output signal, and a second current signal SI2 having a current I2 substantially equal to the current I1. The first current signal SI1 is a control signal for controlling an oscillation frequency of the ICO 16, and the second current signal SI2 is used for detecting a current by the current comparator 19.

The ICO 16 generates an oscillation frequency signal fi having a frequency corresponding to the current I1 of the first current signal SI1, and supplies this oscillation frequency signal fi to the first frequency divider 17. The V/I converter 15 and the ICO 16 can constitute a voltage controlled oscillator (VCO).

The first frequency divider 17 frequency-divides the oscillation frequency signal fi of the ICO 16 by a frequency dividing value N, and generates a first frequency divided signal fo. The first frequency divided signal fo is supplied to the second frequency divider 18, and as a PLL oscillation signal to an external circuit (not shown). The frequency dividing value N can be changed by a control signal generated by the signal generation circuit 20.

The second frequency divider 18 frequency-divides the first frequency signal fo by a frequency dividing value M, and generates a second frequency divided signal fp. The second frequency divided signal fp is fed back to the phase comparator 12.

The current comparator 19 detects the second current signal SI2 supplied from the V/I converter 15. Specifically, the current comparator 19 compares a current I2 of the second current signal SI2 with a low reference current Ia as a first reference signal REF-L, and a high reference current Ib as a second reference signal REF-H, and generates a determination signal SC according to a result of the comparison.

The low reference current Ia and the high reference current Ib are set based on the current-oscillation frequency characteristics of the ICO 16 (control characteristics of ICO 16).

Figure 3:
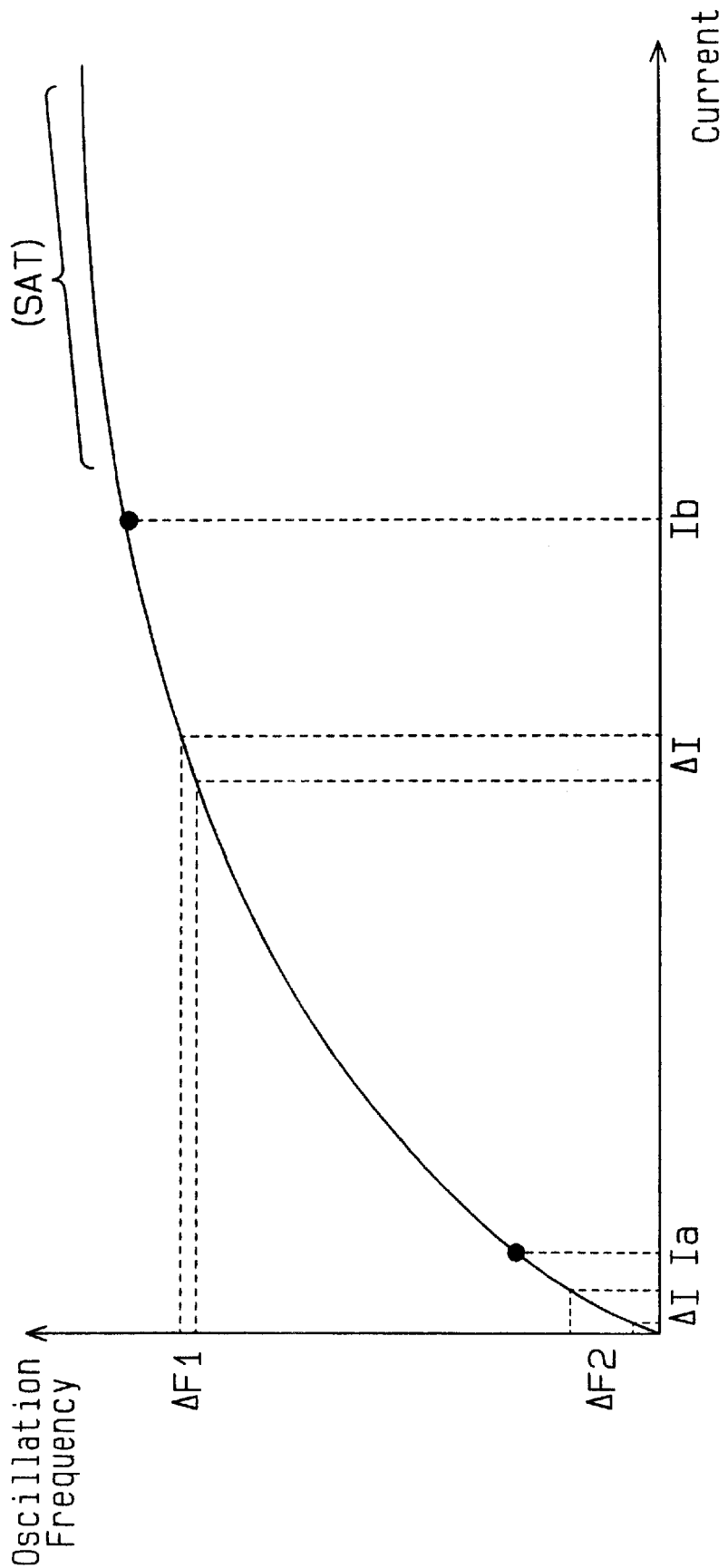
FIG. 3 is a graph showing a relation between a current and an oscillation frequency in a conventional ICO.

As shown in FIG. 3, the oscillation frequency of the ICO 16 increases according to an increase in a current supplied to the ICO 16. That is, as the current I1 of the first current signal SI1 increases, a frequency of the oscillation frequency signal fi of the ICO 16 increases. In the ICO 16 having such a control characteristic, the low reference current Ia is set to a minimum current for enabling the ICO 16 to be stably oscillated, and the high reference current Ib is set to a maximum current for enabling the ICO 16 to be stably oscillated.

In the first embodiment, the low reference current Ia is set to a minimum current for enabling a transistor in the ICO 16 to be used in a saturated region. The reason is that if the current I1 is reduced to a level for forcing the transistor in the ICO 16 to be used in an unsaturated region, an operation characteristic of the transistor becomes unstable, and a control characteristic of the ICO 16 becomes unstable, consequently increasing a jitter.

The high reference current Ib is set to a maximum current for preventing the ICO 16 from being operated in the saturated region (region indicated by "SAT" in FIG. 3). The reason is that if the current I1 of the first current signal SI1 increases to a predetermined level or higher, almost no changes occur in the oscillation frequency of the ICO 16 even when the current I1 is changed.

The signal generation circuit 20 generates four control signals D1 to D4, and an alarm signal D5, in response to the determination signal SC from the current comparator 19. The control signals D1 to D4 are respectively supplied to the first frequency divider 17, the charge pump 13, the loop filter 14, and the V/I converter 15. The first frequency divider 17 changes the frequency dividing value N in response to the control signal D1. The charge pump 13 changes the current of the charge pump output signal SCP in response to the control signal D2. The loop filter 14 changes at least one of a resistance and a capacity in response to the control signal D3. That is, a charging/discharging characteristic by the charge pump 13 can be changed. The V/I converter 15 changes a voltage/current conversion rate (ratio of an output current with respect to an input voltage of the V/I converter 15) in response to the control signal D4. That is, a ratio of the oscillation frequency of the ICO 16 with respect to an output voltage of the loop filer 14 is changed based on the control signal D4. When the control signal D4 is supplied to the VCO substantially equivalent to the V/I converter 15 and the ICO 16, the VCO changes its own gain in response to the control signal D4.

The signal generation circuit 20 generates the alarm signal D5 when the current I2 of the second current signal SI2 is larger than the high reference current Ib. That is, the signal generation circuit 20 generates the alarm signal D5 in response to the determination signal SC from the current comparator 19 indicating a relation of current I2>high reference current Ib, and then supplies the alarm signal D5 to, for example a CPU 100. The CPU 100 controls the PLL loop 10 such that the current I1 of the control signal (i.e., first current signal SI1) of the ICO 16 can be smaller than the high reference current Ib.

Figure 5:
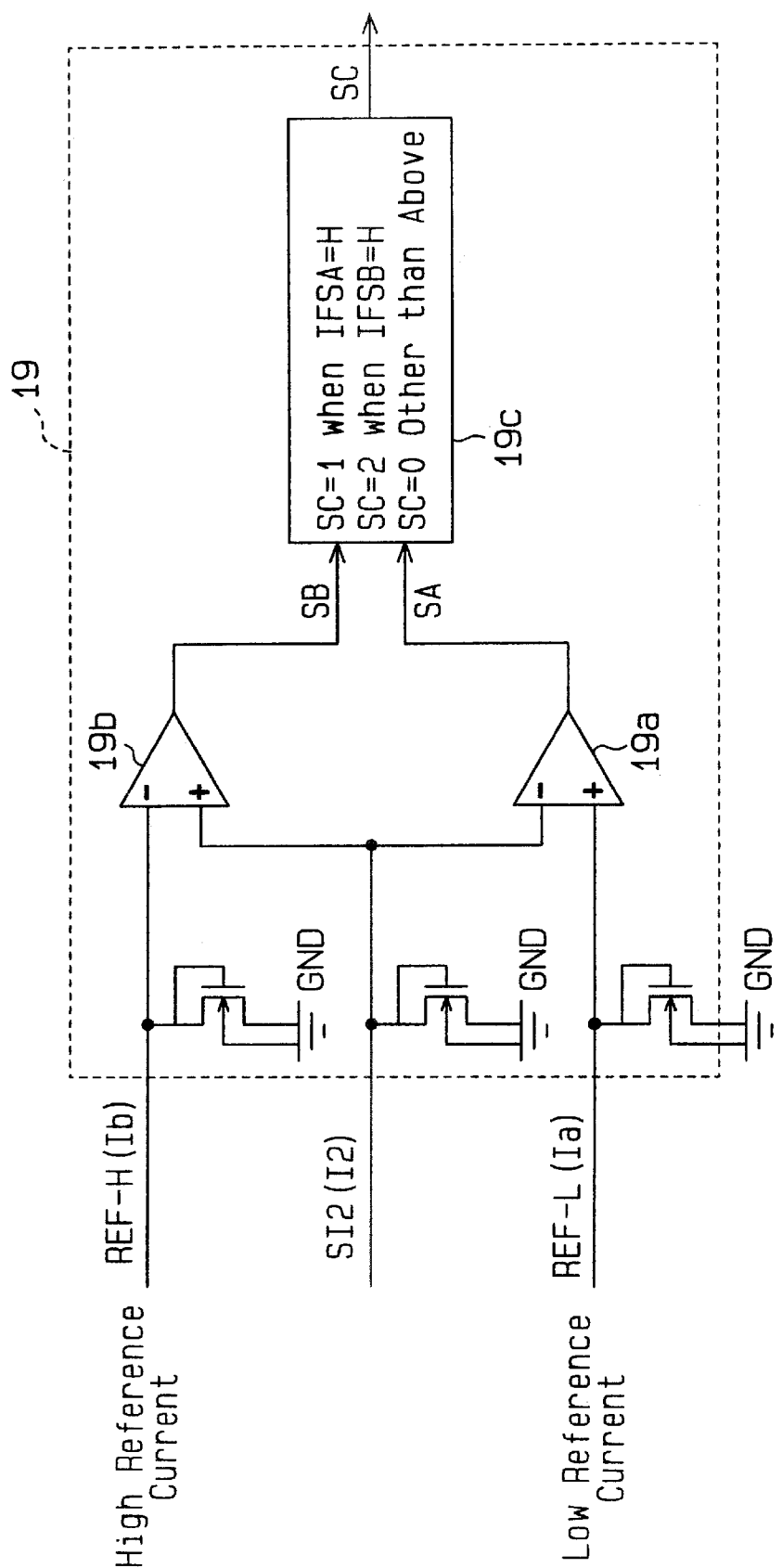
FIG. 5 is a schematic circuit diagram showing a current comparator of the PLL circuit of FIG. 4.

As shown in FIG. 5, the current comparator 19 includes first and second comparators 19a and 19b, and a determination circuit 19c for generating a determination signal SC corresponding to comparison output signals from the first and second comparators 19a and 19b.

A first reference signal REF-L (low reference current Ia) is supplied to a non-inversion input terminal of the first comparator 19a, and a second current signal SI2 (current I2) is supplied to its inversion input terminal. When the current I2 is smaller than the low reference current Ia, the first comparator 19a generates a comparison output signal SA of an H (high) level.

A second reference signal REF-H (high reference current Ib) is supplied to an inversion input terminal of the second comparator 19b, and a second current signal SI2 (current I2) is supplied to its non-inversion input terminal. Thus, when the current I2 is larger than the high reference current Ib, the second comparator 19b generates a comparison output signal SB of an H level.

The determination circuit 19c generates a determination signal SC having a value "1" in response to the comparison output signal SA of the H level supplied from the first comparator 19a. The determination circuit 19c generates a determination signal SC having a value "2" in response to the comparison output signal SB of the H level supplied from the second comparator 19b. The determination circuit 19c generates a determination signal SC having a value "0", when comparison output signals of L levels are output from the first and second comparators 19a and 19b (i.e., low reference current Ia<current I2<high reference current Ib).

Figure 6:
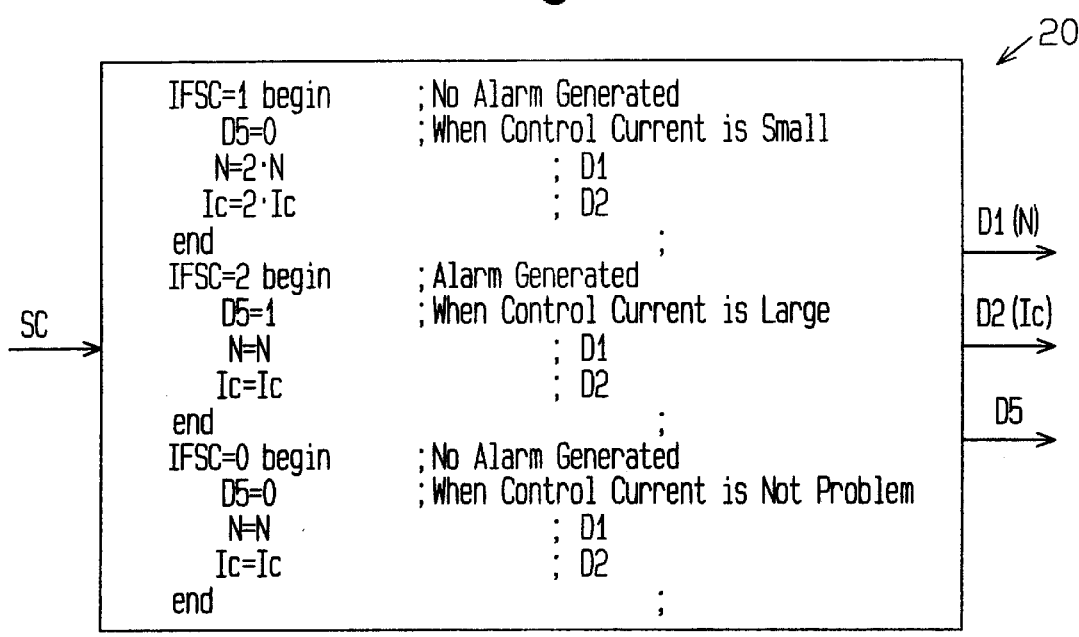
FIG. 6 is a schematic block diagram showing a signal generation circuit of the PLL circuit of FIG. 4.

As shown in FIG. 6, the signal generation circuit 20 generates the control signals D1 to D4 and the alarm signal D5 according to the determination signal SC generated from the determination circuit 19c of the current comparator 19. In FIG. 6, generation of the control signals D1 and D2, and the alarm signal D5 is shown. Description of generation of the control signals D3 and D4 is omitted.

In response to the determination signal SC of a value "1", the signal generation circuit 20 generates a control signal D1 for changing the frequency dividing value N of the first frequency divider 17 to a value larger by twice ("N=2·N"), and a control signal D2 for changing the current Ic of the charge pump output signal SCP to a current larger by twice ("Ic=2·Ic"). The signal generation circuit 20 may generate only the control signal D1 for changing the frequency dividing value N of the first frequency divider 17 to a value larger by twice ("N=2·N") in response to the determination signal SC of a value "1". Also, the signal generation circuit 20 generates an alarm signal D5 having a value "0". In other words, no alarms are generated.

In response to the determination signal SC of a value "2", the signal generation circuit 20 generates a control signal D1 for maintaining the frequency dividing value N of the first frequency divider 17, and a control signal D2 for maintaining the current Ic of the charge pump output signal SCP. The signal generation circuit 20 may generate only the control signal D1 for maintaining the frequency dividing value N of the first frequency divider 17 in response to the determination signal SC of the value "2". The signal generation circuit 20 generates an alarm signal D5 having a value "1" to generate an alarm.

In response to the determination signal SC of a value "0", the signal generation circuit 20 generates control signals D1 and D2 for maintaining the frequency dividing value N and the current Ic. Further, the signal generation circuit 20 generates an alarm signal D5 having a value "0". The signal generation circuit 20 may generate only the control signal D1 for maintaining the frequency dividing value N in response to the determination signal SC of a value "0".

Now, description is given of a case, where the current I2 is smaller than the low reference current Ia. In this case, the current I1 is also smaller than the low reference current Ia. The low reference current Ia is set to a minimum current for enabling the ICO 16 to be stably oscillated. Thus, a control characteristic of the ICO 16 is unstable in this state.

The first frequency divider 17 changes the frequency dividing value N to, for example a value larger by twice, in response to the control signal D1 from the signal generation circuit 20. The PLL loop 10 is operated such that a frequency of the oscillation frequency signal fi of the ICO 16 can be increased by twice. This is for the purpose of stably operating the PLL loop 10 in a state of {fr=(1/(M·N)fi}.

In this case, as described above with reference to FIG. 3, the oscillation frequency of the ICO 16 increases as the current I1 of the first current signal SI1 (control signal) increases. Accordingly, when the PLL loop 10 operates to increase the oscillation frequency of the ICO 16 by twice, the current I1 also increases.

With an increase in the current I1, the current I2 also increases. When the current I1, i.e., the current I2 becomes larger than the low reference current Ia, the signal generation circuit 20 generates a control signal D1 for maintaining the frequency dividing value N. In this state, a control characteristic of the ICO 16 is stable.

If the current I1 is not larger than the low reference current Ia even when the frequency dividing value of he first frequency divider 17 increases by twice, the signal generation circuit 20 generates a control signal D1 for changing the frequency dividing value N to a value larger by four times or more.

Next, description is given of a case, where the current I2 is larger than the high reference current Ib. In this case, the current I1 is also larger than the high reference current Ib. In this state, a control characteristic of the ICO 16 is unstable.

The signal generation circuit 20 supplies an alarm signal D5 to the CPU 100 to generate an alarm in response to the determination signal SC of a value "2". In response to the alarm signal D5, the CPU 100 controls the PLL loop 10 such that the current I1 can be smaller than the high reference current Ib. For example, the CPU 100 reduces a frequency of the reference signal fr supplied to the phase comparator 12 to reduce the current I1.

With a reduction in the current I1, the current I2 is also reduced. When the current I1, i.e., the current I2 becomes smaller than the high reference current Ib, the signal generation circuit 20 generates a control signal D1 for maintaining the frequency dividing value N. In this state, a control characteristic of the ICO 16 is stable.

A natural angular frequency ωn, and a damping coefficient ζ in the PLL circuit 11 are generally represented by the following equations 1 and 2.

$$\omega n = \text{root}((Kv \cdot Ic)/(M \cdot N \cdot C)) \quad (1)$$

$$\zeta = (\tfrac{1}{2})\omega n \cdot R \cdot C \quad (2)$$

Here,
Kv=VCO gain [Hz/V]
Ic=output current [A] of charge pump 13
N=frequency dividing value of first frequency divider
M=frequency dividing value of second frequency divider
R=constant of loop filter 14 (resistance) [Ω]
C=constant of loop filter (capacity) [F]

The VCO gain Kv represents a ratio of the oscillation frequency of the ICO 16 with respect to the filtered output voltage of the loop filter 14. The VCO gain Kv can be changed by changing a rate of voltage/current conversion in the V/I converter 15 according to the control signal D4.

Generally, when the natural angular frequency ωn and the damping coefficient ζ are changed, a change also occurs in a frequency convergence characteristic of the PLL oscillation frequency signal of the PLL circuit 11. Thus, these factors should preferably be kept at constant values.

Therefore, when the frequency dividing value N of the first frequency divider 17 is charged, at least one selected from the VCO gain Kv, the current Ic of the charge pump 13, and the capacity C of the loop filter 14 is changed in order to keep the natural angular frequency ωn constant.

The VCO gain Kv can be changed by the control signal D4, the current Ic of the charge pump 13 can be changed by the control signal D2, and the capacity C of the loop filter 14 can be changed by the control signal D3. When the capacity C of the charge pump 13 is changed, a resistance R of the charge pump 13 is also changed by considering a change in the damping coefficient ζ. In the first embodiment, for example when the frequency dividing value N is increased by twice, the current Ic of the charge pump 13 is increased by twice (see FIG. 6).

Next, description is given of an operation of the PLL circuit.

When the frequency of the oscillation frequency signal fi of the ICO 16 in the PLL loop 10 is reduced, the frequency of the first frequency divided signal fo is also reduced. When the frequency of the first frequency divided signal fo becomes smaller than a desired locked frequency, a frequency of a second frequency divided signal becomes smaller than the frequency of the reference signal fr, and a phase difference is generated between the signals fr and fp. In this case, the phase comparator 12 generates an up signal UP having a pulse width larger than that of a down signal DN. Accordingly, the charge pump 13 performs charging for a longer time than discharging for the loop filter 14. As a result, the loop filter 14 increases a voltage of the filtered output signal SLF. The V/I converter 15 generates a first current signal SI1 from the filtered output signal SLF and, in response to this first current signal SI1, the ICO 16 increases the frequency of the oscillation frequency signal fi.

When the frequency of the oscillation frequency signal fi of the ICO 16 increases, and the frequency of the first frequency dividing signal fo becomes larger than a desired locked frequency, the frequency of the second frequency divided signal fp becomes larger than that of the reference signal fr. In this case, the phase comparator 12 generates an up signal UP having a pulse width smaller than that of a down signal DN according to a phase difference between the signals fp and fr. Accordingly, the charge pump 13 performs charging for a shorter time than discharging for the loop filter 14. As a result, a voltage of the filtered output signal SLF decreases. In response to the first current signal SI1 generated by the V/I converter 15, the ICO 16 decreases the frequency of the oscillation frequency signal fi.

The PLL loop 10 repeats the above-described operation, and matches (locks) the frequency of the first frequency divided signal fo with a desired frequency.

Hereinafter, description is given of control processing of the current comparator 19 and the signal generation circuit 20 by referring to flowcharts of FIGS. 7 and 8.

Figure 7:
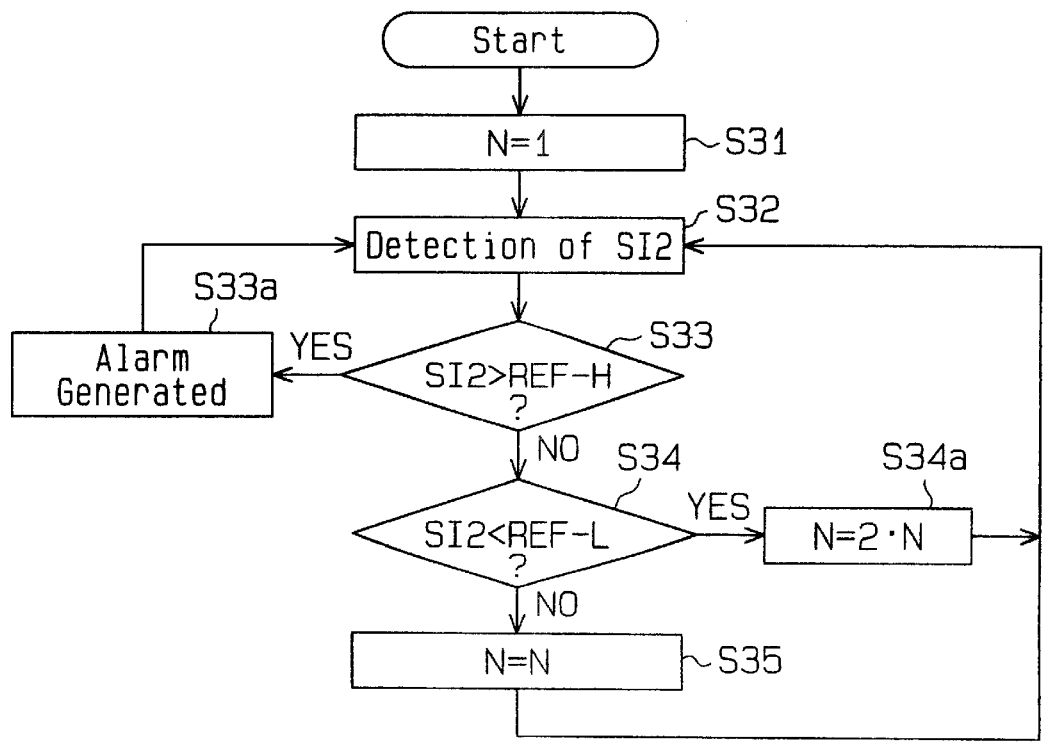
FIG. 7 is a flowchart illustrating control processing of the PLL circuit of FIG. 4.

As shown in FIG. 7, first, a frequency dividing value N of the first frequency divider 17 is set to an initial value "1" (step S31). The current comparator 19 detects a second current signal SI2 (step S32), and compares a current I2 of the second current signal SI2 with a high reference current Ib (step S33). If the current I2 is larger than the high reference current Ib, the current comparator 19 generates a predetermined determination signal SC. In response to this determination signal SC, the signal generation circuit 20 generates an alarm signal D5 in order to generate an alarm (step S33a). The CPU 100 controls the PLL loop 10 such that a current I1 of a first current signal SI1 is smaller than the high reference current Ib.

Then, the current comparator 19 compares the current I2 with a low reference current Ia (step S34). If the current I2 is smaller than the low reference current Ia, the current comparator 19 generates a predetermined determination signal SC. In response to this determination signal SC, the signal generation circuit 20 generates a control signal D1 for changing a frequency dividing value N of the first frequency divider 17 to a value larger by twice (step S34a). Accordingly, in response to the control signal D1, the PLL loop 10 operates to increase an oscillation frequency of the ICO 16 by twice. Thus, the current I1 of the first current signal SI1 becomes larger than the low reference current Ia.

Thus, when the oscillation frequency of the ICO 16 increases by twice, the first frequency divider 17 generates a first frequency divided signal fo by frequency-dividing the oscillation frequency signal fi of the ICO 16 with a frequency dividing value 2N. Thus, even when the oscillation frequency of the ICO 16 increases by twice, no changes occur in a frequency of a PLL oscillation frequency signal output from the PLL circuit 11. As a result, it is possible to prevent unlocking.

In step S34, if the current I2 is larger than the low reference current Ia (i.e., Ia<I2<Ib), the signal generation circuit 20 generates a control signal D1 for maintaining the frequency dividing value N (step S35).

Figure 8:
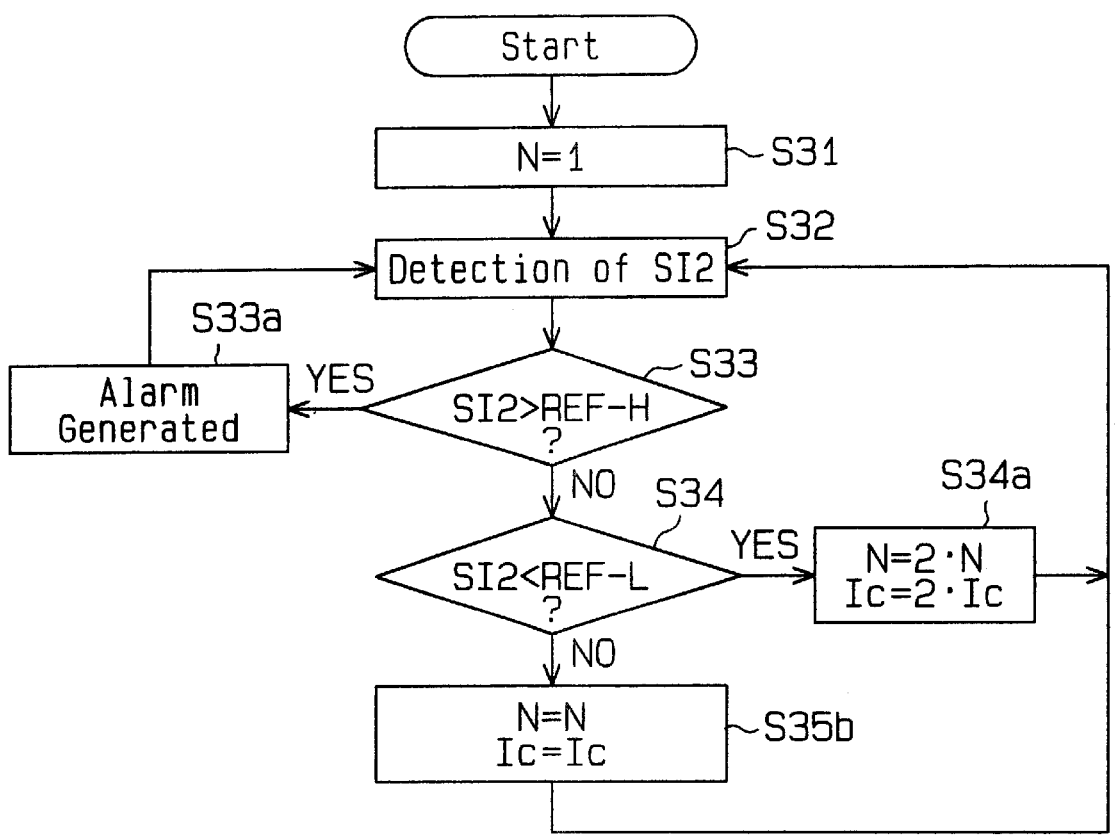
FIG. 8 is a flowchart illustrating control processing of the PLL circuit of FIG. 4.

FIG. 8 is a flowchart illustrating another control processing by the signal generation circuit 20. In this control processing, when a frequency dividing value N of the first frequency divider 17 is changed, a current Ic of the charge pump 13 is also changed in order to keep a natural angular frequency ωn constant. In FIG. 8, processing similar to that of FIG. 7 is denoted by a similar step code.

In step S34, if a current I2 is smaller than a low reference current Ia, the signal generation circuit 20 generates a control signal D1 for changing the frequency dividing value N of the first frequency divider 17 to a value larger by twice, and a control signal D2 for increasing the current Ic of the charge pump 13 by twice (step S34). By this control, the current I1 of the first current signal SI1 becomes larger than the low reference current Ia. Moreover, since the natural angular frequency ωn, and the damping coefficient ζ are kept constant, no changes occur in a frequency convergence characteristic.

In step S34, if the current I2 is larger than the low reference current Ia (i.e., Ia<I2<Ib), the signal generation circuit 20 generates a control signal D1 for maintaining the frequency dividing value, and a control signal D2 for maintaining the current Ic (step S35b).

The PLL circuit of the first embodiment has the following advantages:

(1) The PLL circuit includes the current comparator 19 provided to detect the second current signal SI2 having the current I2 substantially equal to the current I1 of the first current signal SI1 for controlling the oscillation frequency of the ICO 16. The current comparator 19 compares the current I2 with the low and high reference currents Ia and Ib, and generates the determination signal SC according to the result of the comparison. The signal generation circuit 20 generates the control signals D1 to D4 and the alarm signal D5 according to the determination signal SC. By control using these signals, the current I1 of the first current signal SI1 is controlled in the range of the low and high reference currents Ia and Ib. Thus, it is possible to reduce a jitter, and obtain a stable control characteristic.

(2) If the current I2 is smaller than the low reference current Ia, the frequency dividing value N of the first frequency divider 17 is changed to a frequency dividing value of N×n by increasing the oscillation frequency of the ICO 16 so as to set the current I2 larger than the low reference current Ia. In this case, the first frequency divider 17 generates the first frequency divided signal fo by frequency-dividing the oscillation frequency signal of the ICO 16 with the frequency dividing value N×n. Accordingly, no changes occur in an oscillation frequency output from the PLL circuit 11. Thus, it is possible to prevent unlocking.

(3) When the current I1 is set in the range of the low and high reference currents Ia and Ib, the ICO 16 is stably oscillated. In this state, by properly changing the frequency dividing value N of the first frequency divider 17, it is possible to obtain a desired locked frequency.

(4) The current comparator 19 monitors a current quantity for deciding the oscillation frequency of the ICO 16. Thus, it is possible to make utmost use of the frequency range for stably oscillating the ICO 16.

(5) The frequency dividing value N of the first frequency divider 17 can be changed while keeping constant the natural angular frequency ωn and the damping coefficient ζ in the PLL circuit. Thus, since no changes occur in the frequency convergence characteristic, it is possible to obtain a stable control characteristic.

(6) The current comparator 19 includes the first and second comparators 19a and 19b, and the determination circuit 19c for generating the determination signal SC according to the comparison output signals SA and SB. The signal generation circuit 20 includes the arithmetic processing circuit for generating the control signals D1 to D4 and the alarm signal D5 according to the determination signal SC. Thus, the circuitry of each of the current comparator 19 and the signal generation circuit 20 is simplified, and a circuit area occupying the PLL circuit 10 is relatively small.

Figure 9:
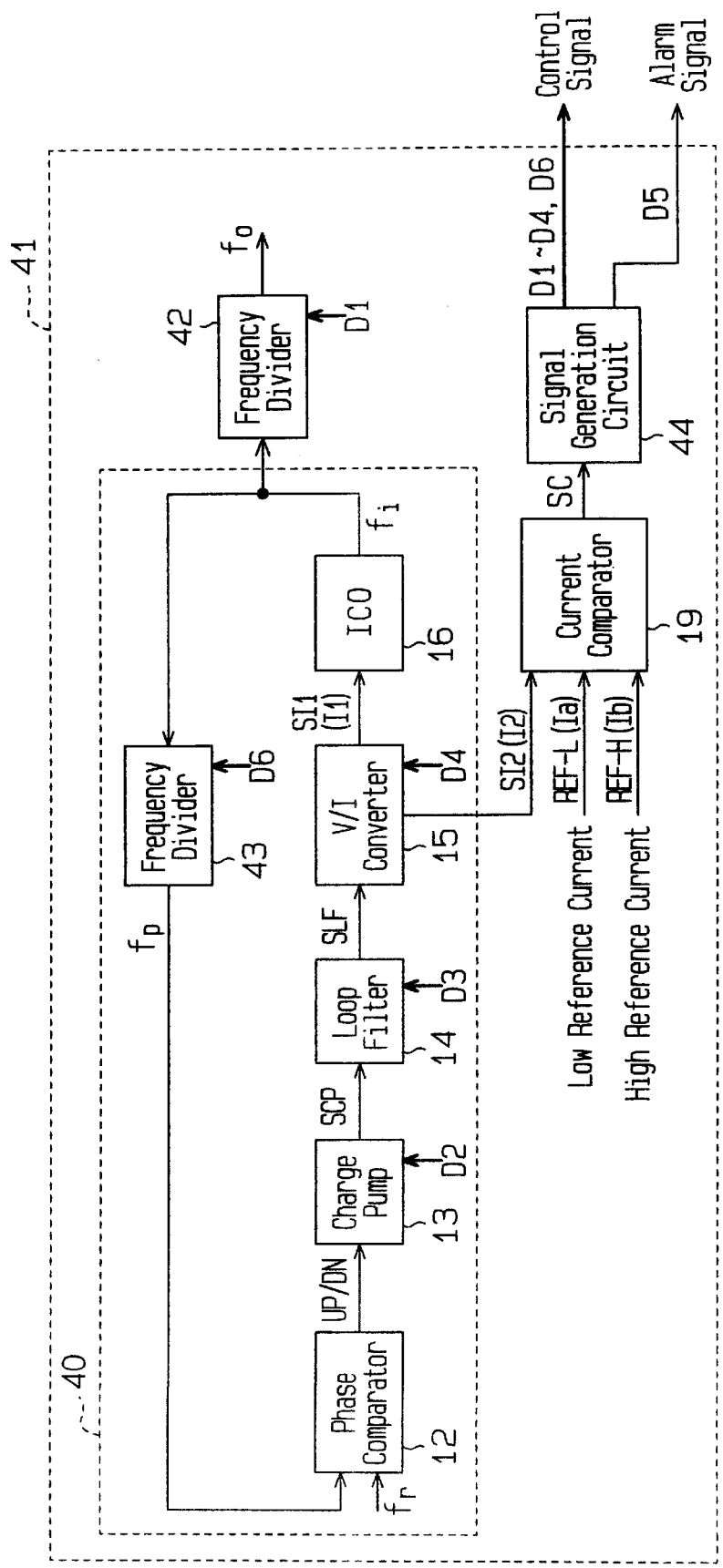
FIG. 9 is a schematic block diagram showing a PLL circuit according to a second embodiment of the present invention.

As shown in FIG. 9, a PLL circuit 41 of a second embodiment of the present invention includes first and second frequency dividers 42 and 43 connected to an ICO 16. The first frequency divider 42 frequency-divides an oscillation frequency of the ICO 16 with a frequency dividing value N, and generates a PLL oscillation frequency signal supplied to an external circuit (not shown). The second frequency divider 43 frequency-divides the oscillation frequency of the ICO 16 with the frequency dividing value N, and supplies a second frequency divided signal fp to a phase comparator 12. In the second embodiment, the phase comparator 12, a charge pump 13, a loop filter 14, a V/I converter 15, the ICO 16, and the second frequency divider 43 constitute a PLL loop 40. The first frequency divider 42 is provided independently of the PLL loop 40.

A signal generation circuit 44 generates control signals D1 to D4 and D6, and an alarm signal D5 according to a determination signal SC from a current comparator 19. A frequency dividing value N of the first frequency divider 42 can be changed according to the control signal D1, and a frequency dividing value M of the second frequency divider 43 can be changed according to the control signal D6.

The current comparator 19 detects a second current signal SI2 having a current I2 substantially equal to a current I1 of a first current signal SI1 for controlling the oscillation frequency of the ICO 16.

If the current I2 is smaller than a low reference current Ia, the signal generation circuit 44 generates control signals D1 and D6 for respectively changing frequency dividing values N and M of the first and second frequency dividers 42 and 43 to frequency dividing values larger by N×n, and M×n, respectively. The second frequency divider 43 changes the frequency dividing value M to the frequency dividing value M×n in response to the control signal D6. Accordingly, the PLL loop 40 operates to increase the oscillation frequency of the ICO 16 to a frequency larger by n times and, correspondingly to this operation, the current I1 also increases. As a result, the current I1 becomes larger than the low reference current Ia.

The first frequency divider 42 changes the frequency dividing value N to the frequency dividing value N×n in response to the control signal D1. That is, the first frequency divider 42 frequency-divides an oscillation frequency n times larger than that of the ICO 16 by the frequency dividing value N×n, and supplies a first frequency divided signal fo as a PLL oscillation signal to an external circuit (not shown). Because of this frequency division control, no changes occur in an oscillation frequency output from the PLL circuit 41. Thus, it is possible to prevent unlocking.

If the frequency dividing value M of the second frequency divider 43 is changed so as to increase the current I1, the signal generation circuit 44 generates control signals D2 to D4 such that a natural angular frequency ωn and a damping coefficient ζ can be kept constant.

If the current I2 is larger than a high reference current Ib, the signal generation circuit 44 generates an alarm signal D5 in such a way as to set the current I1 smaller than the high reference current Ib.

In the second embodiment, instead of being similar n, magnifications of the frequency dividing values N and M may be different. In this case, magnifications must be set such that the current I1 can be set in the range of the low and high reference currents Ia and Ib, and the ICO 16 can be stably oscillated.

Figure 10:
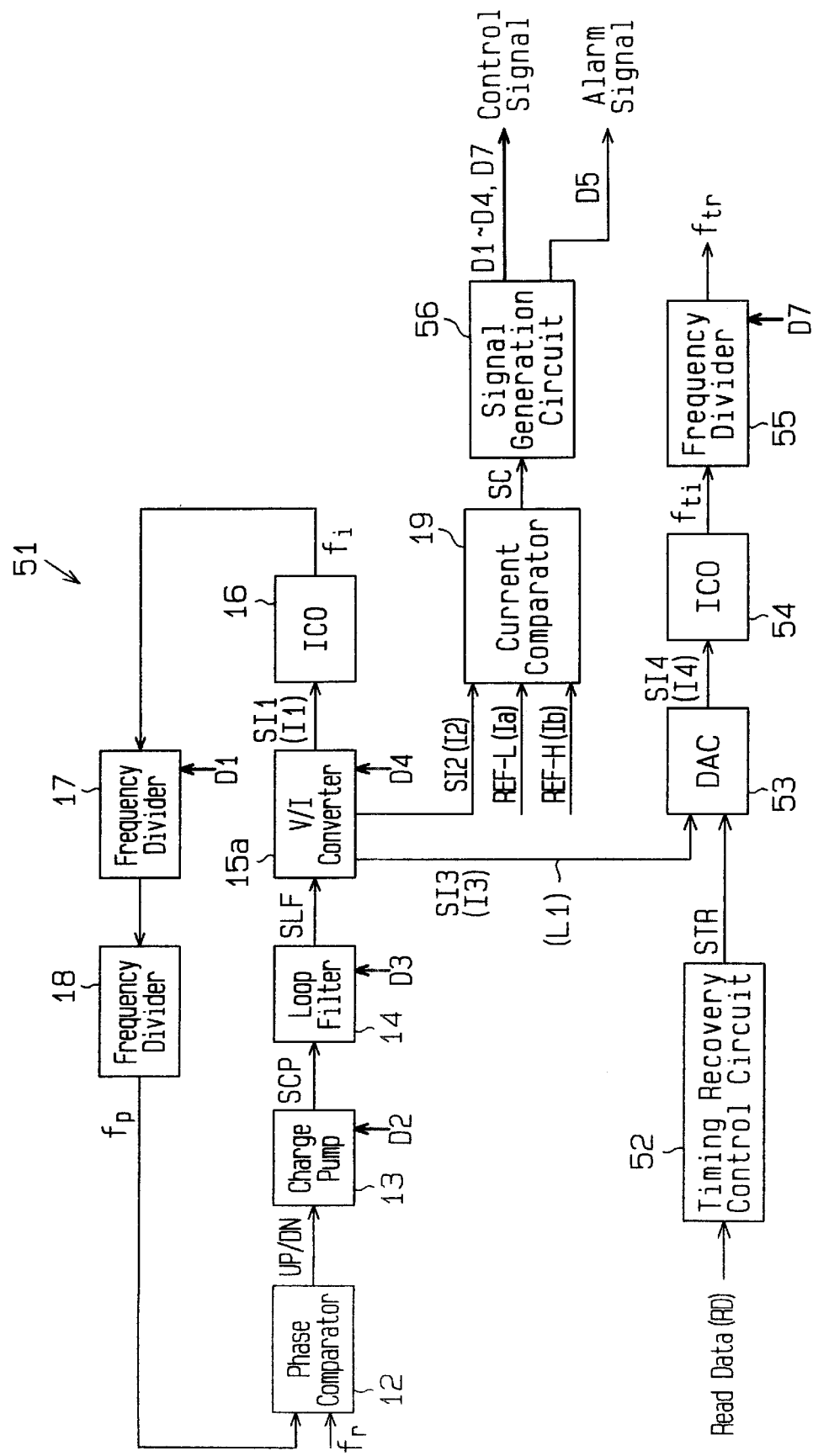
FIG. 10 is a schematic block diagram showing a TR-PLL according to a third embodiment of the present invention.

As shown in FIG. 10, a timing recovery PLL circuit (referred to as TR-PLL, hereinafter) 51 of a third embodiment of the present invention includes a phase comparator 12, a charge pump 13, a loop filter 14, a V/I comparator 15a, a first ICO 16, a first frequency divider 17, a second frequency divider 18, a current comparator 19, a signal generation circuit 56, a timing recovery control circuit (referred to as TR control circuit, hereinafter) 52, a digital/analog conversion circuit (referred to as DAC, hereinafter) 53 as a current controller, a second ICO 54, and a third frequency divider 55.

The first and second ICO 16 and ICO 54 have ICO control characteristics substantially similar to each other (see FIG. 3). That is, when the same currents are supplied to the first and second ICO 16 and 54, the ICO 16 and 54 oscillates at frequencies substantially equal to each other.

The V/I converter 15a performs voltage/current conversion on a filtered output signal, and generates a first current signal SI1 for controlling the first ICO 16, a second current signal SI2 for detecting a current, and a third current signal SI3 for controlling the second ICO 54. The first to third current signals SI1 to SI3 respectively have currents I1 to I3.

The TR control circuit 52 receives a reading signal RD, detects a phase difference of the reading signal RD with respect to a third frequency divided signal ftr output from the third frequency divider 55, and generates a control signal STR. The reading signal RD is read from a recording medium (not shown) according to the third frequency divided signal ftr.

The DAC 53 corrects the current I3 of the third current signal SI3 according to the control signal STR supplied from the TR control circuit 52, and generates a fourth current signal SI4 having a corrected current I4. For example, the TR control circuit 52 generates a control signal STR having a corrected value d according to a phase difference. The DAC 53 corrects the current I3 of the third current signal SI3 according to the control signal STR, and generates a fourth current signal SI4 having a current I4 (I4=I3×d).

The second ICO 54 supplies an oscillation frequency signal fti having a frequency corresponding to the current I4 of the fourth current signal SI4 to the third frequency divider 55. The third frequency divider 55 frequency-divides the frequency of the oscillation frequency signal fti by a frequency dividing value L, and generates a third frequency divided signal ftr. The frequency dividing value L of the third frequency divider 55 can be changed according to a control signal D7 generated by the signal generation circuit 56.

The TR-PLL 51 matches (locks) the frequency of the third frequency divided signal ftr with the frequency of the reading signal RD read from the recording medium. By this frequency locking, a reading operation is stabilized.

It is assumed that the first to third current signals SI1 to SI3 having the currents I1 to I3 substantially equal to one another have been output from the V/I converter 15a.

If the current I2 is smaller than the low reference current Ia, the frequency dividing value N of the first frequency divider 17 is changed to a frequency dividing value of N×n, and an oscillation frequency of the first ICO 16 increases to an oscillation frequency larger by n times. By this control processing, the current I1 becomes larger than the low reference current Ia, and the current I3 also becomes larger than the low reference current Ia.

For example, when a corrected value d of the control signal STR of the TR control circuit 52 is "1", the current I4 of the fourth current signal SI4 output from the DAC 53 is substantially equal to the current I3. Thus, an oscillation frequency of the second ICO 54 increases to an oscillation frequency larger by n times as in the case of the first ICO 16.

The signal generation circuit 56 generates a control signal D7 for changing the frequency dividing value L of the third frequency divider 55 to a frequency dividing value L×n. In response to the control signal D7, the third frequency divider 55 generates a third frequency divided signal ftr by frequency-dividing the oscillation frequency larger by n times of the second ICO 54. That is, when the oscillation frequency of the first ICO 16 increases to an oscillation frequency larger by n times in order to increase the current I1, an oscillation signal fti having a frequency larger by n times than that of the second ICO 54 is frequency-divided by a frequency dividing value L×n of the third frequency divider 55.

Normally, in the TR-PLL 51, the V/I converter 15a and the DAC 53 are connected by a relatively long wire L1. This is for the purpose of preventing the oscillation frequency of the second ICO 54 from being drawn into the oscillation frequency of the first ICO 16 by disposing the first and second ICO 16 and 54 physically away from each other. In addition, the current I3 flowing through the wire L1 is set larger than the current I1 (current I2). Thus, it is difficult for the wire L1 to be affected by noise.

If the current I3 is set larger than the current I1 (I2), a frequency dividing value L of the third frequency divider 55 is set according to a magnitude of the current I2. That is, the frequency dividing value L is set to a value different from the frequency dividing value N.

It should be apparent to those skilled in the art that the present invention may be embodied in many other specific forms without departing from the spirit or scope of the invention. Particularly, it should be understood that the invention may be embodied in the following forms.

In place of the V/I converter 15 (15*a*) and the ICO 16, a VCO may be used. In this case, an oscillation frequency of the VCO may be controlled such that a control voltage of the VCO is within a predetermined range.

In the foregoing, generation of an alarm by the alarm signal D5 was carried out only when the current I1 (I2) becomes larger than the high reference current Ib. However, alarm generation may be carried out also when the current I1 becomes smaller than the low reference current Ia.

The current comparator 19 may detect the first current signal SI1 (current I1) in place of the second current signal SI2 (current I2).

Therefore, the present examples and embodiments are to be considered as illustrative and not restrictive and the invention is not to be limited to the details given herein, but may be modified within the scope and equivalence of the appended claims.

What is claimed is:

1. A phase locked loop (PLL) circuit comprising:
   a phase comparator for generating a phase difference signal by comparing a phase of a reference signal with a phase of a comparison signal;
   an oscillator, connected to the phase comparator, for generating an oscillation frequency signal having an oscillation frequency according to a control signal having one of a current and a voltage corresponding to the phase difference signal;
   a first frequency divider, connected to the oscillator, for generating first frequency-divided signal by frequency-dividing the oscillation frequency signal with a first frequency dividing value;
   a detection circuit for generating a detection signal by detecting one of the current and the voltage of the control signal; and
   a signal generation circuit, connected to the detection circuit, for generating a first signal for changing the first frequency-divided signal and supplying the first signal to the first frequency divider such that one of the current and the voltage of the control signal is within a predetermined range in accordance with the detection signal.

2. The PLL circuit according to claim 1, further comprising a charge pump, connected to the phase comparator, for generating a charge pump output signal having a current according to the phase difference signal; and
   a loop filter connected to the charge pump, having a resistor and a capacitor, and removing a high-frequency component contained in the charge pump output signal to generate a filtered signal as a control signal,
   wherein the signal generation circuit generates a second signal for controlling at least one selected from a current of the charge pump output signal, a resistance of the loop filter, a capacity of the loop filter, and a gain of the oscillator in order to keep constant a natural angular frequency and a damping coefficient in the PLL circuit.

3. The PLL circuit according to claim 1, further comprising a second frequency divider, connected to the first frequency divider, for generating a second frequency-divided signal as the comparison signal by frequency-dividing the first signal with a second frequency dividing value,
   wherein the signal generation circuit generates a first signal for changing the first frequency dividing value according to the detection signal.

4. The PLL circuit according to claim 3, wherein the signal generation circuit generates a first signal for changing the first frequency dividing value to a frequency dividing value of a predetermined multiple of the first frequency dividing value according to the detection signal indicating that one of the current and the voltage of the control signal is outside the predetermined range.

5. The PLL circuit according to claim 4, wherein the predetermined range is defined by one selected from a minimum current and a minimum voltage for stably oscillating the oscillator, and one selected from a maximum current and a maximum voltage for stably oscillating the oscillator.

6. The PLL circuit according to claim 5, wherein the signal generation circuit generates a first signal for changing the first frequency dividing value according to a detection signal indicating that a current of the control signal is smaller than the minimum current or a voltage of the control signal is smaller than the minimum voltage.

7. The PLL circuit according to claim 1, further comprising a second frequency divider, connected to the first frequency divider, for generating a second frequency-divided signal as the comparison signal by frequency-dividing the first frequency-divided signal with a second frequency dividing value,
   wherein the signal generation circuit generates a first signal for changing the first and second frequency dividing values according to the detection signal.

8. The PLL circuit according to claim 7, wherein a changing rate of the first frequency dividing value is equal to a changing rate of the second frequency dividing value.

9. The PLL circuit according to claim 1, wherein when one of the current and the voltage of the control signal is in the predetermined range, the first frequency dividing value can be changed.

10. The PLL circuit according to claim 1, wherein the signal generation circuit generates an alarm signal according to a detection signal indicating that one of the current and the voltage of the control signal is outside the predetermined range.

11. The PLL circuit according to claim 1, wherein the detection circuit includes
    a first comparator for generating a first current difference signal by comparing the current of the control signal with a current of a first reference current signal,
    a second comparator for generating a second current difference signal by comparing the current of the control signal with a current of a second reference current signal, and
    a determination circuit connected to the first and second comparators for generating the detection signal according to the first and second current difference signals.

12. A phase locked loop (PLL) circuit, comprising:
    a phase comparator for generating a phase difference signal by comparing a phase of a reference signal with a phase of a comparison signal;
    a first oscillator for generating a first oscillation frequency signal having an oscillation frequency according to a first control signal having one of a current and a voltage corresponding to the phase difference signal;
    a second oscillator for generating a second oscillation frequency signal having an oscillation frequency according to a second control signal originated from the first control signal, having one of a current and a voltage;
    a detection circuit for generating a detection signal by detecting one of the current and the voltage of the first control signal; and a signal generation circuit, connected to the detection circuit, for generating a signal for changing the oscillation frequency of the first oscillator such that one of the current and the voltage of the second control signal is within a predetermined range in accordance with the detection signal.

13. The PLL circuit according to claim 12, wherein the current of the second control signal is equal to or greater than the current of the first control signal, and the voltage of the second control signal is equal to or greater than the voltage of the first control signal.

14. The PLL circuit according to claim 12, further comprising a charge pump, connected to the phase comparator, for generating a charge pump output signal having a current according to the phase difference signal; and a loop filter connected to the charge pump, having a resistor and a capacitor, and removing a high-frequency component contained in the charge pump output signal to generate a filtered signal, wherein the signal generation circuit generates a signal for controlling at least one selected from a current of the charge pump output signal, a resistance of the loop filter, a capacity of the loop filter, and a gain of the oscillator in order to keep constant a natural angular frequency and a damping coefficient in the PLL circuit.

15. The PLL circuit according to claim 12, further comprising a first frequency divider, connected to the first oscillator, for generating a first frequency-divided signal by frequency-dividing a first oscillation frequency signal with a first frequency dividing value; and a second frequency divider for generating a second frequency divided signal as a comparison signal by frequency-dividing a frequency of the first frequency divided signal with a second frequency dividing value, wherein the signal generation circuit generates a signal for changing the first frequency dividing value according to the detection signal.

16. The PLL circuit according to claim 15, further comprising a third frequency divider, connected to the second oscillator, for generating a third frequency divided signal by frequency-dividing a second oscillation frequency signal with a third frequency dividing value, wherein the signal generation circuit generates a signal for changing the third frequency dividing value by a changing rate equal to or higher than the first frequency dividing value.

17. The PLL circuit according to claim 12, wherein the signal generation circuit generates an alarm signal according to a detection signal indicating that one of the current and the voltage of the first control signal is outside the predetermined range.

18. The PLL circuit according to claim 12, wherein the detection circuit includes a first comparator for generating a first current difference signal by comparing the current of the first control signal with a current of the first reference current signal, a second comparator for generating a second current difference signal by comparing the current of the first control signal with a current of the second reference current signal, and a determination circuit, connected to the first and second comparators, for generating a detection signal corresponding to the first and second current difference signals.

19. The PLL circuit according to claim 1, wherein the signal generating circuit generates a second signal for changing the oscillation frequency of the oscillator such that one of the current and the voltage of the control signal is within a predetermined range in accordance with the detection signal.

20. The PLL circuit according to claim 1, wherein the signal generation circuit generates a second signal for changing the oscillation frequency of the oscillator such that one of the current and the voltage of the control signal is within a predetermined range in accordance with the detection signal.

* * * * *